United States Patent [19]

Clough et al.

[11] Patent Number: 4,832,870
[45] Date of Patent: May 23, 1989

[54] ELECTRICALLY CONDUCTIVE COMPOSITE MATERIAL

[75] Inventors: Roger L. Clough; Alan P. Sylwester, both of Albuquerque, N. Mex.

[73] Assignee: The United States Department of Energy, Washington, D.C.

[21] Appl. No.: 209,119

[22] Filed: Jun. 20, 1988

[51] Int. Cl.$^4$ ............................ H01B 1/06; C08J 9/40
[52] U.S. Cl. ...................................... 252/511; 252/500; 252/506; 521/53; 521/54; 521/55; 521/918
[58] Field of Search ....................... 252/500, 506, 511; 521/53, 54, 55, 918

[56] References Cited

U.S. PATENT DOCUMENTS

| | | | |
|---|---|---|---|
| 2,856,263 | 10/1958 | Carter et al. | 23/14.5 |
| 3,000,698 | 9/1961 | Crowe | 23/14.5 |
| 3,110,656 | 11/1963 | Mills | 204/193.2 |
| 3,391,281 | 7/1968 | Eerkens | 250/199 |
| 3,394,997 | 7/1968 | Hollander | 23/346 |
| 3,758,664 | 9/1973 | Gerrald | 423/15 |
| 3,952,263 | 4/1976 | McArthur et al. | 331/94.5 P |
| 3,998,925 | 12/1976 | Fuller | 423/15 |
| 4,039,703 | 8/1977 | Kamijo et al. | 55/158 |
| 4,126,420 | 11/1978 | Fuller | 422/162 |
| 4,160,956 | 7/1979 | Fader | 331/94.5 P |
| 4,255,393 | 3/1981 | Chiang | 423/15 |
| 4,338,215 | 7/1982 | Shaffer et al. | 252/628 |
| 4,431,575 | 2/1984 | Fujie et al. | 252/511 |
| 4,505,973 | 3/1985 | Neet et al. | 252/511 |
| 4,528,212 | 7/1985 | Cairns et al. | 427/96 |
| 4,719,039 | 1/1988 | Leonardi | 252/511 |

OTHER PUBLICATIONS

T. Kerley et al., "Construction of Supported Fission Foils for Laser Excitation", *Rev. Sci. Instruments*, vol. 48, No. 5, May 1977, pp. 557–559.

A. Voinov et al., "Fission–Pumped He–Xe and Ar–Xe Infrared Lasers", *Sov. Tech. Phys. Letters.*, vol. 7, No. 8, Aug. 1981, pp. 437–438.

*Primary Examiner*—Morton Foelak
*Attorney, Agent, or Firm*—Armand McMillan; James H. Chafin; William R. Moser

[57] ABSTRACT

An electrically conductive composite material is disclosed which comprises a conductive open-celled, low density, microcellular carbon foam filled with a nonconductive polymer or resin. The composite material is prepared in a two-step process consisting of first preparing the microcellular carbon foam from a carbonizable polymer or copolymer using a phase separation process, then filling the carbon foam with the desired non-conductive polymer or resin. The electrically conductive composites of the present invention has a uniform and consistant pattern of filler distribution, and as a result is superior over prior art materials when used in battery components, electrodes, and the like.

12 Claims, 1 Drawing Sheet

CARBONIZATION TEMPERATURE, °C
CARBON FOAM/EPOXY COMPOSITES
CARBON FOAM DENSITY: 60 mg/cc

ELECTRICALLY CONDUCTIVE COMPOSITE MATERIAL

FIELD OF THE INVENTION

The invention relates to an electrically conductive composite material which comprises a conductive, open-celled, low-density, microcellular carbon foam filled with a non-conductive polymer or resin. The Government has rights in this invention pursuant to Contract No. DE-AC04-76DP00789 awarded by the U.S. Department of Energy.

BACKGROUND OF THE INVENTION

Recently, extensive research has been directed to produce organic materials with good engineering properties and environmental stability which are also electrically conductive. Lightweight, stable, conductive organic materials would be useful in applications such as battery components, electrodes, electromagnetic interference shields, circuitry components, lightning tolerant aircraft surfaces, and electromagnetic radiation absorbers (e.g., EMP protection). There are at present two main approaches to producing conductive organic materials. These two methods are (1) preparation of highly conjugated polymers (such as polyacetylene), which are then doped with certain additives, and (2) dispersion of conductive filler particles (such as metal powders, chopped carbon fibers, etc.) in common organic resins. Numerous organic polymers of the polyacetylene type can be "doped" to conductivity. However, due to problems with dopant migration, processing difficulties, and poor environmental and chemical (e.g., oxygen) stabilities, these conducting organic polymers have not as yet realized wide application. With regard to prior art two-phase conductive materials, particularly non-conductive organic polymers and conductive filler particles, the conductivity is largely determined by close contacts between the conductive filler particles. Thus, often a high concentration (typically 30 to 40% by volume) of conductive filler is necessary to provide a continuous pathway for charge "percolation".

These prior art organic materials suffer from problems of uniformity and reproducibility, due primarily to the difficulty of obtaining uniform and consistent distribution of the filler particles. What is desired, therefore, is the preparation of a new type of electrically conductive composite material which has a homogeneous distribution of filler particles, and this composite would have substantially advantageous properties and processability when compared with the currently available materials.

SUMMARY OF THE INVENTION

A novel electrically conductive composite material has been discovered which comprises a conductive, open-called, low-density, microcellular, partially graphitized, carbon foam filled with a non-conductive polymer or resin. The open-celled carbon foam of the composite material provides a porous three-dimensional conductive framework which is readily filled with the insulating polymer or resin in a uniform and consistent pattern of distribution. As a result, the novel electrically conductive composite material of the present invention has substantially advantageous properties, particularly in terms of versatility and processibility, when compared with the prior art materials, and this composite material will be superior in a wide variety of applications.

BRIEF DESCRIPTION OF THE DRAWING FIGURES

DETAILED DESCRIPTION OF THE PREFERRED EMBODIMENT

Figure 2:
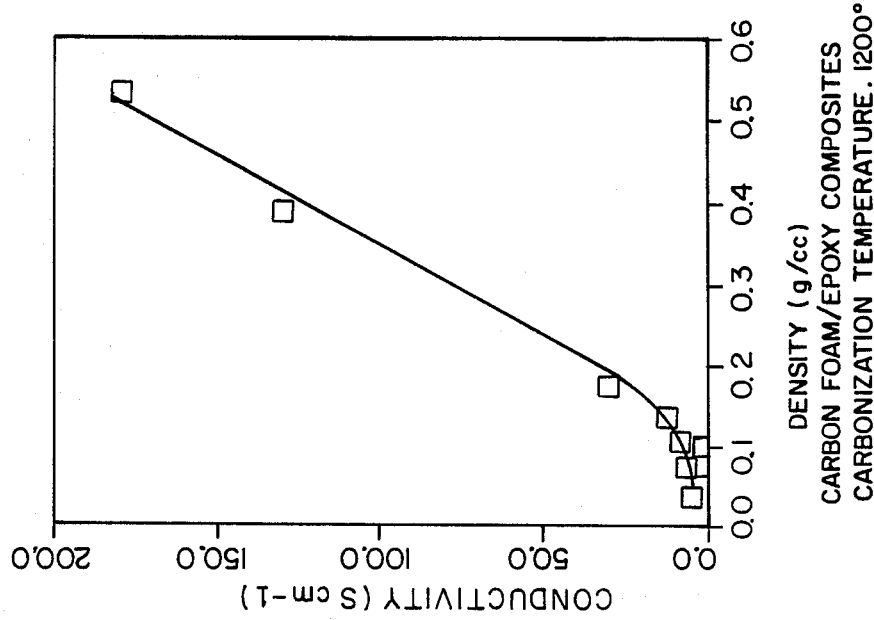
FIG. 2 is a graph showing conductivity versus carbon foam density for carbon foam composites prepared in accordance with the present invention.

The electrically conductive composite material of the present invention is prepared in what is basically a two step process. In the first step, a low-density, open-celled, carbonized conductive microcellular carbon foam is prepared, and in the second step, the foam is filled with a non-conductive polymer or resin. Low-density microcellular carbon foams suitable for use in the present invention are preferably prepared using a phase-separation process disclosed in a co-pending U.S. patent application Ser. No. 209,168. In this process, a carbonizable polymer or copolymer is dissolved completely in a solvent, after which the solution is cooled, the solvent removed, and the carbonizable polymeric material is carbonized in a high temperature oven. It is particularly preferred that the carbonizable polymeric materials used be either acrylonitrile-based polymers such as polyacrylonitrile (PAN), or acrylonitrile-based copolymers, such as a polyacrylonitrile-maleic anhydride copolymer. The resulting low-density carbon foams are homogeneous and open-celled with uniform cell sizes typically 1 to 20 micrometers. The carbon foams used in the present invention generally will have densities which range from about 0.01 to 1.00 grams per cubic centimeter. It is particularly preferred that the carbon foam densities be in the range of from about 0.04 to 0.50 grams per cubic centimeter (2% to 30% carbon by volume, respectively). After the carbon foams have been prepared, they can then be filled with suitable non-conductive bulk polymeric materials. Typical dimensions of the carbon foams are approximately 120 mm $\times$ 30 mm $\times$ 7 mm.

In the second step of the preparation of the composite material of the present invention, the large continuous void volume of the carbon foam is filled with a non-conductive polymer, reactive monomer, or resin in a mold under vacuum. Curing of the resin or polymer results in a solid polymeric block having bulk properties characteristic of the chosen organic filler. Successful composites have been prepared with a number of non-conductive resins and polymers. Examples of suitable non-conductive resins for the composite material include epoxy resins and phenolic resins. An example of a non-conductive polymer suitable for the present invention is a polymerized polystyrene monomer. The various composites prepared containing these non-conductive materials have been easily machined to fine dimensions.

Carbon foam composites prepared in accordance with the present invention have conductivities ranging from $10^{-7}$ to $10^2$ S/cm. Most of this volume is occupied by the organic resin, and thus the bulk mechanical properties and environmental stability of these composites mimic those of the pure resin. These properties should make these materials useful for the various applications discussed above, e.g., battery components, electrodes, etc. The novel carbon foam composites should also provide substantially greater electrical conductivity at much lower volume percent carbon as compared with prior art carbon-filled composites. This is due to the "built-in" conductivity of the carbon foam. The carbon foam composites of the present invention should also provide a more controllable conductivity since the interconnectivity is not subject to a highly process dependent dispersion of particles or orientation of fibers as is observed in the prior art. The present carbon foam composite provides a material with a conductivity that is very isotropic and homogeneous throughout the material thickness. This should be a distinctive advantage in comparison to composites based on dispersed fibers where uniformity is hard to achieve due to difficulties with dispersion or settling. In addition, the use of a carbon foam as the conductive filler offers numerous process variables which can be used to "fine tune" the conductive composite for a specific application.

The electrical conductivity of the composites of the present invention can be precisely and reproducibly varied over a wide range (many orders of magnitude) through control of foam carbonization temperature and thus graphitic content. Conductivity can also be varied in a number of different ways including varying carbon foam density (volume percent conductive filler), incorporating conductive/insulating additives into the carbon foam (e.g., metals or metal oxides), and in choosing a particular carbon precursor polymer. Carbon foams useful in the present invention have been prepared from copolymers of polyacrylonitrile and maleic anhydride, and varying ratios of these precursors gives control of percentage graphitic carbon at fixed carbonization temperatures. The bulk properties of the composite can be varied through the use of a wide range of non-conductive polymers or resins which fill the carbon foams. As novel organic conductors, these new composites should also show enhanced environmental, chemical, and thermal stabilities in engineering properties which closely mimic the known properties of the non-conductive bulk polymer that is chosen.

The variability of conductivity of carbon foam composites of the present invention has been demonstrated with composites prepared using epoxy resin as the filler. By varying the process parameters discussed above, carbon foam/epoxy composites were prepared with conductivities which were precisely varied throughout the range from $10^{-7}$ to $10^2$ S/cm. This conductivity spans the range from electronic insulators through semiconductors to metal-like conductors. By further varying the carbon foam process parameters, it is likely that the conductivity range can be further extended.

Figure 1:
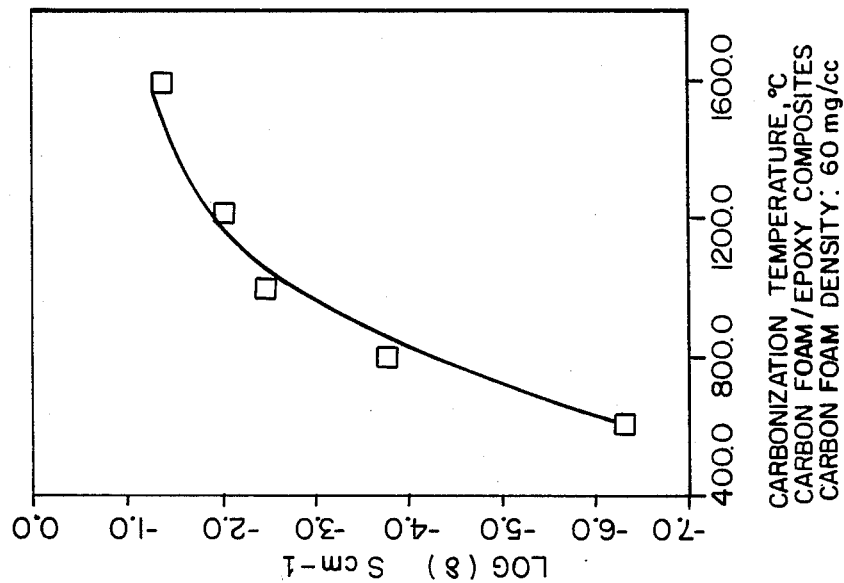
FIG. 1 is a graph showing conductivity versus carbonization temperatures for carbon foam composites prepared in accordance with the present invention.

In order to "fine tune" the conductive composite for a specific application, control of foam carbonization temperature has been observed to play a significant role in final measurements of conductivity. In tests of conductivity on carbon foam/epoxy resin filler composites prepared in accordance with the present invention, an extremely wide conductivity range ($10^{-7}$ to $10^{-1}$ S/cm) was demonstrated with a very low volume percent carbon laoding simply through adjustment of the foam carbonization temperature. FIG. 1 shows a plot of conductivity as a function of carbonization temperature (over the range studied) for epoxy-filled carbon foams at a single density of 0.06 g/cc. This low-density carbon foam loading corresponds to approximately 3.5% carbon by volume. As can be observed, increase in carbonization temperature are accompanied by increases in the measured conductivity of the composites studied.

Conductivity of the composites can also be increased by increasing the carbon density (volume percent carbon) of the foams, as can be observed in FIG. 2. Tests were made of composite conductivity for carbon-/epoxy composites prepared using foams carbonized at 1200° C. As indicated graphically in FIG. 2, the conductivities of the higher density carbon foam composites were greater than those of the lower density foams. The range of carbon foam densities for these tests was from about 3% to 33% carbon by volume. It should be noted that the highest density carbon foam/epoxy composite had a conductivity approximately 1–2 orders of magnitude greater than prior art materials currently available which are loaded at comparable volume percent carbon with spherical particles. Other methods contemplated for tailoring the conductivity of the composites of the present invention include varying parameters such as carbon foam morphology, incorporating conductive or insulating additives into the carbon foam, and selectively choosing the carbon foam precursor polymer.

Tests on the composites of the invention also show that the bulk properties of the composites can be varied as well, primarily through the use of a wide range of non-conductive polymers or resins which fill the carbon foams. An initial series of composites has been investigated by three-point bend testing. The flexural modulus of the conductive composites with foam densities up to 0.13 g/cc showed moduli identical to the bulk epoxy resin. This was expected, as it was thought that the engineering properties of the composites would mimic the known properties of the non-conductive bulk polymer that was chosen. At a carbon foam density of 0.64 g/cc, the composite modulus had increased by 50% over the modulus of the bulk resin. However, it was observed that both the flexural strength and failure strain decreased with increased carbon foam density. The flexural strength of the composites tested was at least 50% of that the unloaded epoxy resin. With the lower-density carbon foam loadings, the flexural strength of the composites is approximately 75% of that of neat epoxy resin. This provides an indication of the moderate perturbation that the low-carbon foam loadings have on the mechanical properties of the resin. If desired, mechanical properties of the composites of the invention can be significantly enhanced through the introduction of reinforcing carbon or glass fibers into the carbon foams. It is expected that the composite materials of the present invention can thus provide strong carbon foam composites which have greater electrical conductivities than can be obtained using present conductive organic materials, and which can be used successfully in a variety of applications.

The following examples are presented as illustrative of the present invention and are not intended to limit its scope in any way:

Example 1

A carbonized (1200° C.) polyacrylonitrile (PAN) foam of density 0.06 gram/cc with an isotropic morphology and cell size of 5 micrometers was prepared by the method of Charles Arnold, Jr. et al (as disclosed in co-pending U.S. application Ser. No. 209,168) and filled with an epoxy resin as follows:

(1) The carbon foam was machined to the dimensions of 10 cm × 3 cm × 0.5 cm and placed in the bottom of a rectangular aluminum mold previously treated with mold release.

(2) Epoxy resin (DER-332, Jeffamine T-403) was thoroughly mixed and degassed.

(3) An excess (70 grams) of the epoxy resin was poured onto the carbon foam bar and infused into the foam with the aid of vacuum (<1 mm Hg for 25 min) at room temperature.

(4) The resin was cured at room temperature for 96 hr.

(5) The composite was removed from the mold and the excess of epoxy was machined away exposing the intact filled carbon.

(6) The resulting composite had a density of 1.2 gram/cc and an electrical conductivity of 0.01 S cm$^{-1}$.

Example 2

A carbonized PAN foam as described in Example 1 was filled with a Phenolic resin (Borden SC-1008) and cured. The resultant machined composite had an electrical conductivity of 0.01S cm$^{-1}$.

Example 3

A carbonized PAN foam having a density of 0.1 gram/cc and a carbonization temperature of 1200° C., prepared as described in Example 1, was filled with polystyrene as follows:

(1) The sample was machined to the dimensions of 10 cm×3 cm×0.5 cm and placed in a glass vacuum flask.

(2) A mixture of freshly distilled styrene monomer and AIBN initiator was infused by applying vacuum in three successive freeze (−77° C.)-pump-thaw-cycles.

(3) The flask was sealed under vacuum and the styrene was polymerized at 50° C. for 24 hr followed by 100° C. for 24 hr.

(4) The excess styrene was machined away to expose the intact, filled carbon foam composite.

The resultant composite had an electrical conductivity of 13 S/cm.

It is expected that the electrical conductivity of the composites could be further increased through the incorporation of metals into the initial carbonized foams. Additionally, intercalation of the graphitic regions of the carbon with $I_2$, or $Br_2$ would be expected to increase the conductivity.

What is claimed is:

1. An electrically conductive composite material comprising a low-density, open-celled, carbonized conductive microcellular carbon foam filled with a non-conductive polymer or resin.

2. An electrically conductive composite material according to claim 1 wherein the carbon foam has a density of from 0.1 to 1.00 g/cc.

3. An electrically conductive composite material according to claim 1 wherein the carbon foam has a cell size of from 1–50 micrometers.

4. An electrically composite material according to claim 1 wherein the microcellular carbon foam is filled with a non-conductive resin.

5. An electrically conductive composite material according to claim 4 wherein the non-conductive resin is an epoxy resin.

6. An electrically conductive composite material according to claim 4 wherein the non-conductive resin is a phenolic resin.

7. An electrically conductive composite material according to claim 1 wherein the carbon foam is filled with a non-conductive polymer.

8. An electrically conductive composite material according to claim 7 wherein the non-conductive polymer is a polymerized polystyrene monomer.

9. An electrically conductive composite material according to claim 1 wherein the carbon foam is prepared from polyacrylonitrile.

10. An electrically conductive composite material according to claim 1 wherein the carbon foam is prepared from a copolymer of polyacrylonitrile and maleic anhydride.

11. An electrically conductive composite material according to claim 1 having an conductivity of from about $10^{-7}$ to $10^2$ S/cm.

12. An electrically conductive composite material according to claim 1 further comprising reinforcing carbon or glass fibers.

* * * * *